United States Patent
Baggenstoss et al.

(10) Patent No.: US 6,374,396 B1
(45) Date of Patent: Apr. 16, 2002

(54) CORRECTION OF FIELD EFFECTS IN PHOTOLITHOGRAPHY

(75) Inventors: Bill Baggenstoss, Boise, ID (US); Christophe Pierrat, Hsin-Chu (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/205,896

(22) Filed: Dec. 4, 1998

(51) Int. Cl.[7] .......................... G06F 7/60; G06F 17/10; G06F 17/50; H01L 21/48
(52) U.S. Cl. ................... 716/19; 716/2; 430/5
(58) Field of Search ............................................ 716/19

(56) References Cited

U.S. PATENT DOCUMENTS

| 5,326,659 | A | * | 7/1994 | Liu et al. ...................... 430/5 |
| 5,578,422 | A | * | 11/1996 | Mizuno et al. ............. 430/313 |
| 5,736,300 | A | * | 4/1998 | Mizuno et al. ............. 430/313 |
| 5,786,112 | A | * | 7/1998 | Okamoto et al. ............... 430/5 |
| 5,877,861 | A | | 3/1999 | Ausschnitt et al. .......... 356/401 |
| 5,879,844 | A | * | 3/1999 | Yamamoto et al. ............ 430/30 |
| 5,952,134 | A | | 9/1999 | Hwang ........................ 430/22 |
| 5,989,762 | A | | 11/1999 | Takaoka ...................... 430/30 |
| 6,077,310 | A | * | 6/2000 | Yamamoto et al. ........... 716/19 |
| 6,081,658 | A | * | 6/2000 | Rieger et al. .......... 395/500.22 |
| 6,114,071 | A | * | 9/2000 | Chen et al. ..................... 435/5 |
| 6,128,070 | A | | 10/2000 | Peng ........................... 355/53 |

* cited by examiner

*Primary Examiner*—Matthew Smith
*Assistant Examiner*—A. M. Thompson
(74) *Attorney, Agent, or Firm*—Schwegman, Lundberg, Woessner & Kluth, P.A.

(57) ABSTRACT

Methods of correcting for proximity effect are disclosed, wherein the methods account for intensity level variation across a field of exposure. The methods may be utilized to produce improved masks for reproducing a desired image on a target, often a semiconductor substrate. Furthermore, a system is disclosed to perform the correction methods. Masks and apparatus produced from such masks utilizing the correction methods are also disclosed.

50 Claims, 9 Drawing Sheets

CORRECTION OF FIELD EFFECTS IN PHOTOLITHOGRAPHY

TECHNICAL FIELD OF THE INVENTION

The present invention relates generally to optical lithographic techniques commonly used in the formation of integrated circuits and structures on a semiconductor substrate. In particular, the present invention relates to methods of correcting a mask for use in photolithography, systems to perform the correction and apparatus produced from such a corrected mask.

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever. The following notice applies to the software and data as described below and in the drawing hereto: Copyright© 1998, Micron Technology, Inc., All Rights Reserved.

BACKGROUND OF THE INVENTION

Semiconductor device features are primarily fabricated using photolithography. The art of photolithography embodies techniques for creating two-dimensional patterns on a work surface, or target, by the controlled application of energy (such as electromagnetic, ion beam or other radiation) to a reactive material, or resist, deposited on the target. In a photolithographic process the energy application is controlled through the use of a patterned photomask. The pattern is transferred to a resist coating on the target, forming a resist pattern. The target is then etched according to the resist pattern and, following the etch, subjected to further processing steps. In semiconductor fabrication, the target may be a semiconductor wafer and the resulting features form a portion of a final integrated circuit.

Typically, photolithography is achieved by projecting or transmitting energy through a pattern made of opaque areas and clear areas on a mask. In the case of optical photolithography, the opaque areas of the pattern block light, thereby casting shadows and creating dark areas, while the clear areas allow light to pass, thereby creating light areas. Energy is projected through the clear areas onto and through a lens and subsequently onto the target, such as a semiconductor wafer. The term opaque refers to any area that blocks a sufficient level of the projected energy such that any energy passing through the opaque area will produce only negligible reaction with the resist coating. The term clear refers to any area that permits a sufficient level of energy to project onto the target to react with the resist coating to produce a resist pattern.

In the process of forming a pattern by a projection exposure, it is customary that a member used for reduced-size projection is termed a reticle, and a member for life-size projection is termed a mask; or a member corresponding to an original sheet is termed a reticle, and a member obtained by duplicating such a reticle is termed a mask. In the present invention, any of the masks and reticles classified by such various definitions are referred to as a mask for convenience. Furthermore, the term mask may also refer to a database representation used to produce a physical mask.

The process of producing a mask for an integrated circuit involves generating a composite drawing of the integrated circuit derived from a circuit layout, which is generated from the functional and schematic diagrams. The composite drawing represents the various layers of the integrated circuit, and each layer of the composite drawing will be used to generate a single mask. To transform a layer of the composite drawing into a mask, it is digitized. The resulting database representation defines the opaque and clear areas of the mask. The physical mask is typically produced by selectively establishing areas of opaque material, often a layer of chrome, on a clear support, often a glass or quartz plate. As will be apparent to the reader, areas of the clear support not covered by the opaque material are necessarily clear.

Because of increased semiconductor device complexity which results in increased pattern complexity, and increased pattern packing density on the mask, it is becoming increasingly difficult to produce a precise pattern image despite advances in photolithographic techniques. One problem leading to increased difficulty in transferring a pattern from a mask to the target is proximity effect. Proximity effect can have a pronounced effect when attempting to produce pattern images in the sub-0.5 $\mu$m range. Proximity effect describes the distortion of a pattern image resulting from the presence or absence of other optically opaque areas in the immediate proximity of the pattern. An opaque pattern surrounded by large clear areas will produce a smaller image than if the same pattern is surrounded by other opaque areas. Computer programs have been used to purposefully distort the mask pattern to compensate for proximity effect in an attempt to produce a desired image on the target.

Despite corrections for proximity effect, features will still experience distortion due to varying optics and illumination systems of conventional lithography tools. Furthermore, a given lithography tool will inherently produce distortion due to varying intensity levels across its field of exposure. Intensity levels will vary across a field of exposure due to inabilities to achieve even distribution from the energy source as well as inherent imperfections, defects and other characteristics of the optics.

As can be seen, the accuracy of the mask pattern and the resulting resist pattern play important roles in the quality of the circuit. As feature size decreases, the impact of distortion effects increases proportionately. As manufacturing requirements call for exposure of patterns with smaller and smaller dimensions, it is becoming necessary to employ techniques which permit enhancement of the current performance of the process of photolithography.

SUMMARY OF THE INVENTION

A method is disclosed wherein a photolithographic mask is corrected based on intensity models for various zones across a field. A variety of semiconductor circuits, dies, modules and electronic systems may be produced from masks produced in accordance with the invention. Such apparatus exhibit improved uniformity of features at the circuit level of the apparatus due to a decrease in distortion not possible through typical proximity effect correction.

In one embodiment, the invention provides a method of correcting a photolithographic mask involving defining at least two zones within a field of the mask, defining intensity models for each of the zones, and modifying features on the mask based on the intensity model for the zone in which the feature occurs. In a further embodiment, the invention provides photolithographic masks wherein features on the mask exhibit corrections based on zones within a field of the mask.

In another embodiment, the invention provides a method of producing a photolithographic mask involving generating a database representation of a physical mask; correcting the database representation by defining at least two zones within a field of the mask, defining intensity models for each of the zones, and modifying features of the mask based on the intensity model for the zone in which the feature occurs; and selectively establishing opaque areas on a clear support in response to the corrected database representation. Selectively establishing opaque areas includes selectively depositing opaque material on a portion of a support, as well as depositing a layer of opaque material on a support and selectively removing portions of that layer. In still another embodiment, the invention provides a photolithographic mask having clear and opaque areas on a clear support, wherein the clear and opaque areas are defined by a process including defining at least two zones within a field of the mask, defining intensity models for each of the zones, and modifying dimensions of the opaque areas of the mask based on the intensity model for the zone in which the opaque area occurs. It should be noted that proximity effect correction alternatively could be applied to clear areas instead of opaque areas with identical results. Furthermore, it is trivial that procedures to modify dimensions of opaque areas necessarily modify dimensions of clear areas and vice versa.

In one embodiment, the invention provides a semiconductor die having circuit patterns produced using photolithographic masks wherein features on the mask exhibit corrections based on zones within a field of the mask. In another embodiment, the invention provides a circuit module, wherein the circuit module contains circuit patterns produced using photolithographic masks wherein features on the mask exhibit corrections based on zones within a field of the mask. In a further embodiment, the invention provides an electronic system having at least one circuit module, wherein the circuit module contains circuit patterns produced using photolithographic masks wherein features on the mask exhibit corrections based on zones within a field of the mask.

In another embodiment, the invention provides a computer program for correcting pattern features for proximity effect based on the intensity variations across the field of exposure. In a further embodiment, the invention provides a machine readable medium having instructions stored thereon for correction of pattern features for proximity effect based on the intensity variations across the field of exposure. In a still further embodiment, the invention provides a system for correcting pattern features for proximity effect based on the intensity variations across the field of exposure, wherein the system has such a machine readable medium.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
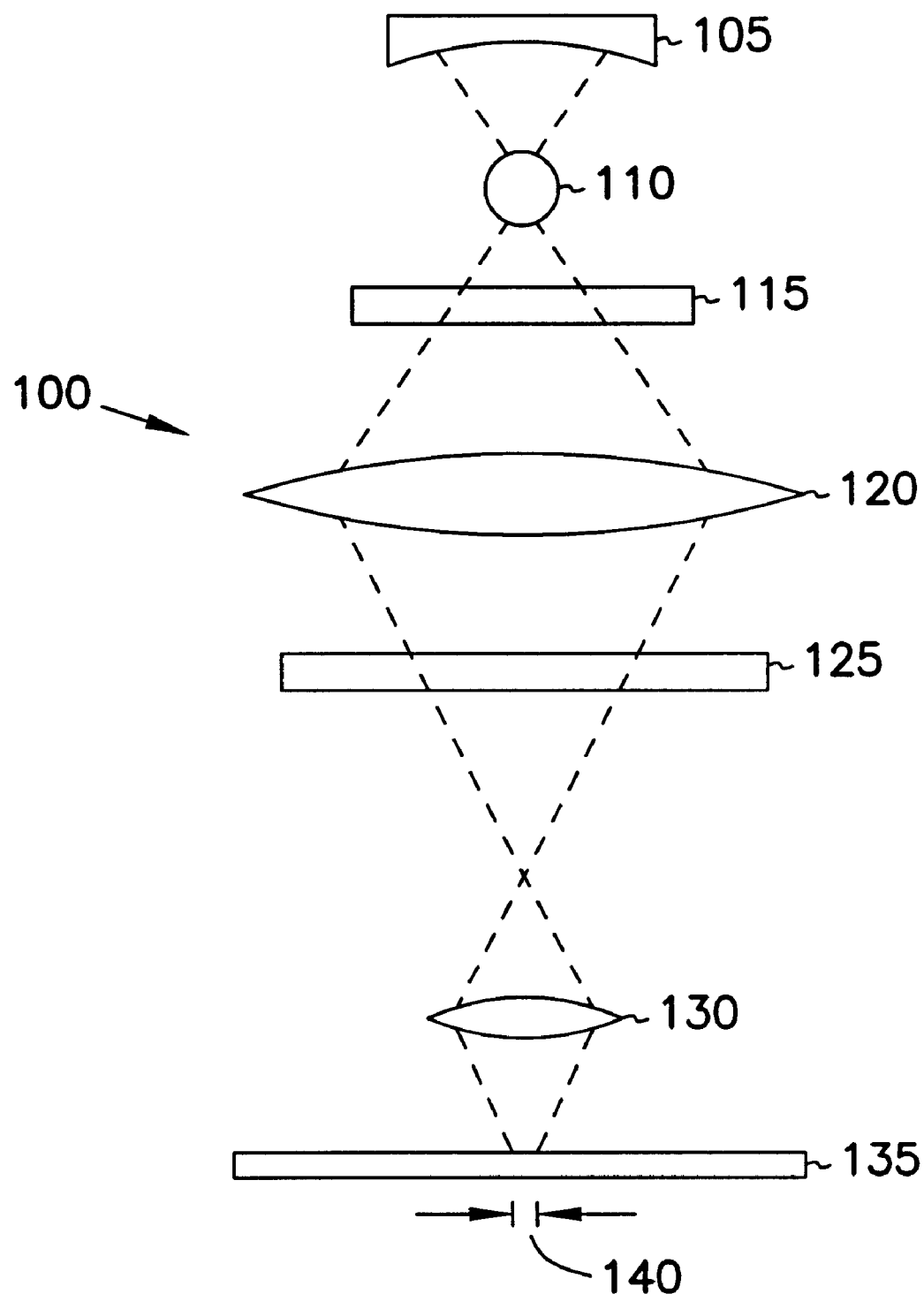
FIG. 1 is a schematic of a photolithography projection system.

FIG. 1 depicts a typical photolithography projection system 100. The type depicted is commonly referred to as a step and repeat reduction system. In this type of system, the target 135 is moved incrementally, or stepped, after each exposure to transfer the pattern of the mask 125 to a previously unexposed portion of the target 135. The process is repeated until the pattern of the mask 125 has been transferred to all desired portions of the target 135, thus, step and repeat. The portion exposed during each period of exposure is referred to herein as the field of exposure 140. The lithography system 100 is termed a reduction system because the pattern within the field of exposure is smaller than the pattern of the mask. The PAS 5500/300C deep UV lithography system available from ASML U.S.A., Tempe, Ariz., USA, is an example of one such system.

Lithography system 100 further contains an energy source 110, a mirror 105, a filter 115, a condensing lens 120 and a reduction lens 130. Those skilled in the art will recognize that condensing lens 120 and reduction lens 130 may each represent a series of lenses. Those skilled in the art will further recognize that other arrangements of energy sources and optics systems are suitable for directing energy through the mask 125 to produce an image on target 135.

In lithography system 100, energy from energy source 110 is passed through filter 115, either directly or upon reflection from mirror 105. Filter 115 is used to reduce the energy variation from energy source 110. This is desirable where the resist is more selective to a specific energy level, or to improve resolution through the use of higher energy levels. For example, in the case where energy source 110 is a Hg light source, the filter may seek to remove all but the G (436 nm), H (405 nm) or I (365 nm) peaks from the Hg spectrum for use with resists selective to those wavelengths. The filter 115 may alternatively be used to pass higher-energy wavelengths such as the mid and deep ultraviolet peaks found at 313 nm and 254 nm, respectively, in the Hg spectrum, provided the resist is responsive to such energy levels.

Condenser lens 120 concentrates the energy from energy source 110 onto mask 125. The energy passing through mask 125 is then redirected onto target 135 through reduction lens 130. Reduction lens focuses the energy onto target 135 so as to reproduce the pattern of mask 125 onto target 135. In the case of semiconductor processing, the energy focused onto target 135 causes a reaction in the resist on the surface of target 135 to define the pattern of one layer of an integrated circuit. Further processing in the completion of an integrated circuit proceeds in a manner well known in the art.

As previously discussed, due to proximity effects, the pattern transferred to target 135 will not be identical to the pattern on mask 125. To produce a desired pattern on target 135, mask 125 must have a "distorted" or corrected pattern. Tools are readily available to correct for proximity effect. One such tool is the OPC (optical proximity correction) tool available from Avanti Corp., Fremont, Calif., USA. Optical proximity correction tools apply model-based corrections to features of a mask in order to compensate for proximity effect. From a fundamental standpoint, if the proximity effect will tend to shrink the feature, the optical proximity correction tool will increase the dimension of the mask pattern to compensate accordingly. However, these tools presume uniform intensity across the field of exposure or otherwise ignore inherent intensity variations. Such assumptions induce uncompensated variation as intensity levels vary across the field.

Figure 2:
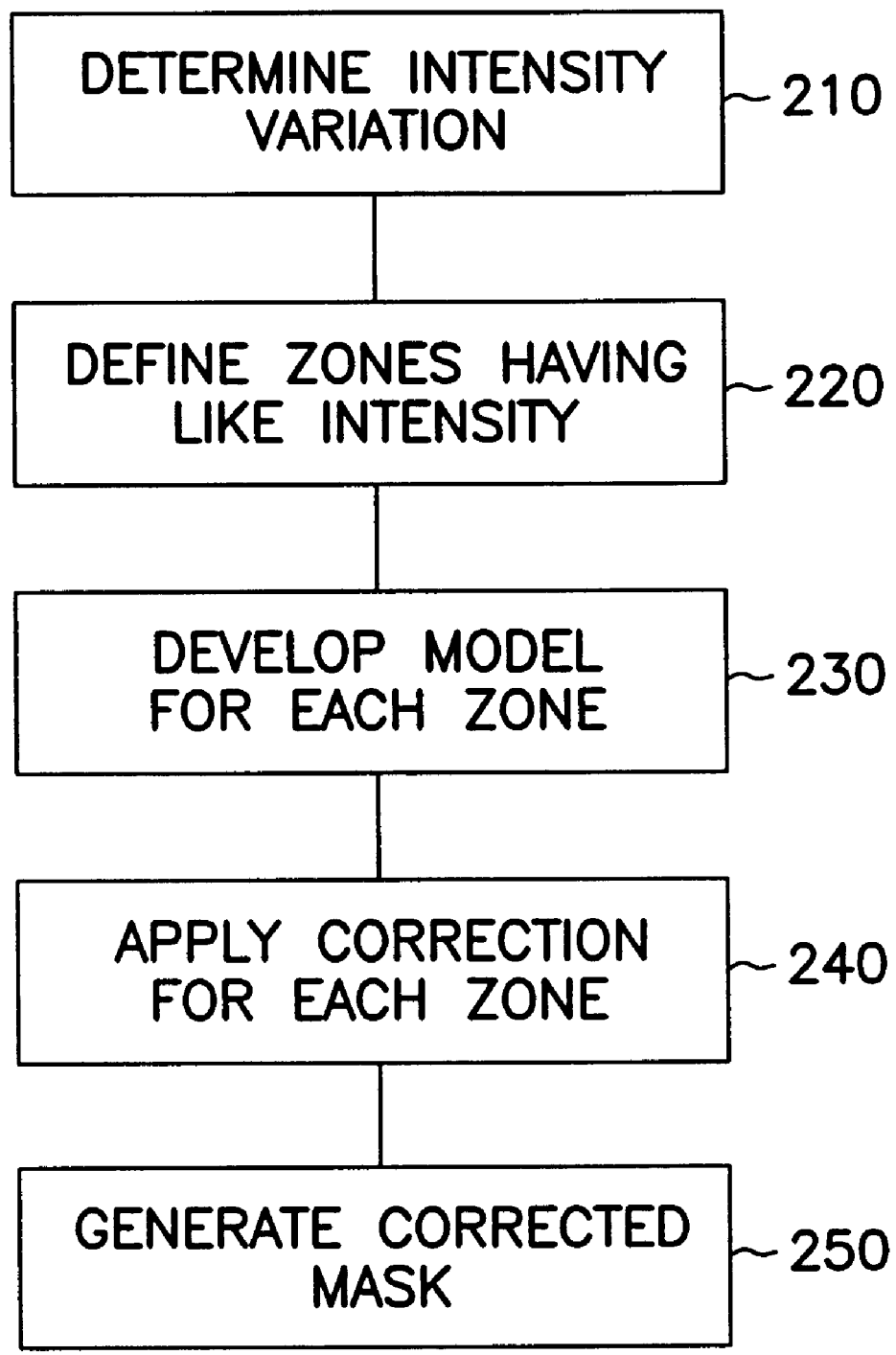
FIG. 2 is a high-level flowchart depicting one embodiment of a method of the invention.

FIG. 2 is a flowchart for a proximity effect correction method of the invention, applying compensation for intensity level variation. FIG. 2 depicts action boxes 210, 220, 230, 240 and 250. In action box 210, the intensity variation across the field of exposure is determined. One way to accomplish this determination is to produce a mask having a series of test patterns. Identical patterns will respond differently across the field of exposure, due to the intensity variation, producing variations in the pattern on the target following etching and removal of the resist. This response can be measured from the dimensions of features in the target pattern compared to the desired dimensions. In this manner, intensity is defined as a function of the optics, the resist and the etch process.

Alternatively, intensity can be determined through the use of the Zernike polynomial. The Zernike polynomial results from the wavefront function for optical systems with circular pupils and describes lens aberrations. If the Zernike coefficient (Z) values are known across the field of exposure ($Z_i = f(x,y)$, with x,y as coordinates in the field), intensity may be calculated as a function of the field coordinates. Other empirical intensity correlations can also be utilized.

Zones having like intensity are defined in action box 220. In the case of utilizing test patterns, a zone may be defined by determining the variation, or relative error, of the translation between the mask pattern and the resulting target pattern. As such, a zone would be defined as a portion of the field of exposure having like error. For example, one zone may be defined as a portion resulting in dimensions representing a 5 to 10% reduction from the desired dimension, another defined as a portion resulting in dimensions representing a 0 to 5% reduction from the desired dimension, another defined as a portion resulting in dimensions representing a 0 to 5% increase from the desired dimension, and so on. It will be apparent that zones having smaller or larger ranges of error are completely within the scope of the invention. While choosing smaller ranges of error will result in better proximity effect correction, it will also result in a larger number of zones and a corresponding increase in the computation required to generate the corrected pattern.

Figure 3:
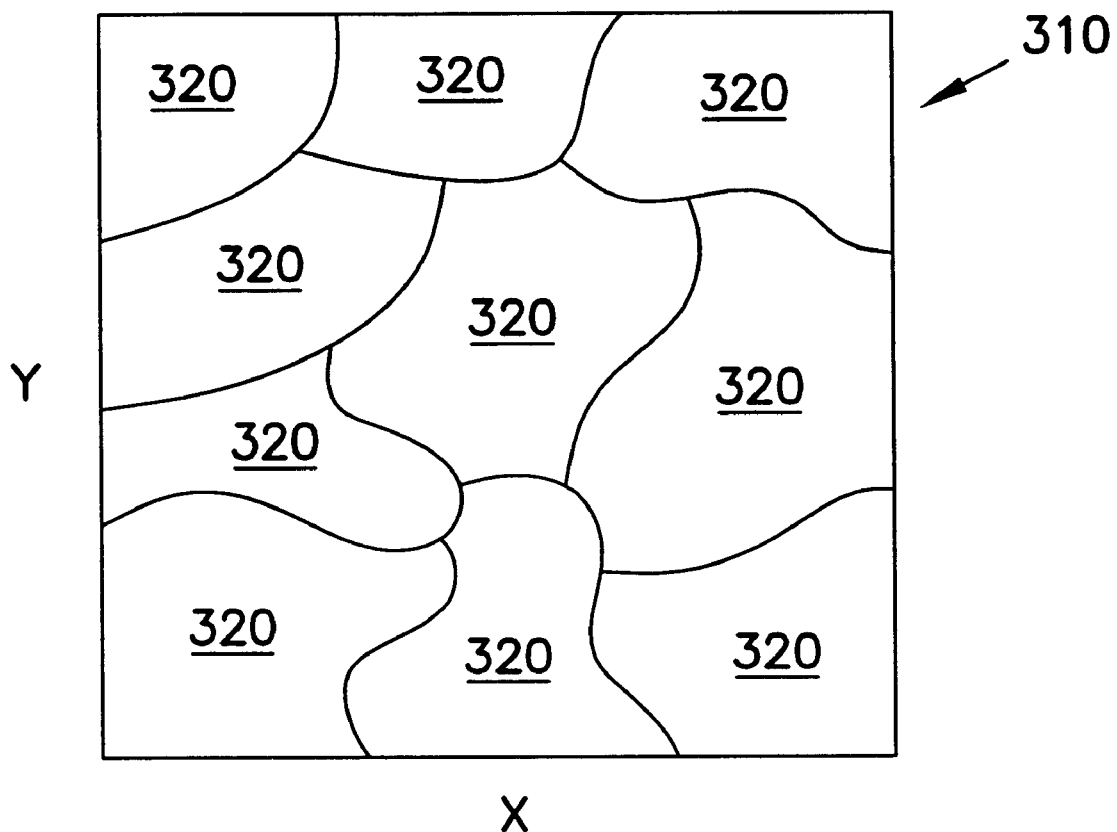
FIG. 3 is a conceptualization of zones defined in a field of exposure for use in the invention.

In the case of determining intensity as a function of lens aberrations or other empirical correlation, zones may be defined as those portions of the field of exposure having like calculated intensities. As with choosing small ranges of error, smaller intensity ranges will result in better proximity effect correction, but increased computation. FIG. 3 depicts a conceptualization of a field of exposure 310 divided into zones 320. Zones 320 are identified by their x and y coordinates, allowing features of a mask pattern to be mapped to a specific zone.

Upon defining zones 320, a correction model is developed in action box 230 for each zone in a manner known in the art. Each pattern feature is then corrected for proximity effect in action box 240 in accordance with the model developed for the zone in which the feature is mapped. It will be recognized that the act of applying a correction may involve an iterative process. This is so because the act of applying a correction to one feature will necessarily change the surroundings of other features, thus changing the proximity effect each feature will experience and thus prompting further correction.

Having applied the correction to each feature, a corrected pattern is generated in action box 250 for production of a mask. The resulting mask will produce a more accurate reproduction of the desired pattern on target 135 due to the correction for intensity variations across the field. It is generally presumed that the performance of an integrated circuit having reduced dimensional variations will exceed the performance of an integrated circuit having increased dimensional variations, all other factors being equal. It is further generally presumed that reductions in dimensional variation of an integrated circuit will result in reduced waste and increased throughput in manufacturing. Another advantage is increased viability of reduced feature sizes, leading to improved use of resources and accompanying cost reductions.

Models assuming uniform intensity must make concessions such that errors induced at both ends of the intensity range are within acceptable tolerances. The result is that an optimized correction is, at best, only applied to portions of the field. Using the invention, the user is capable of applying optimized correction models for each zone of the field, thus reducing the magnitude of concessions required for models assuming uniform intensity across the field. By reducing concessions, a more accurate reproduction of the desired pattern is attainable.

Figure 4:
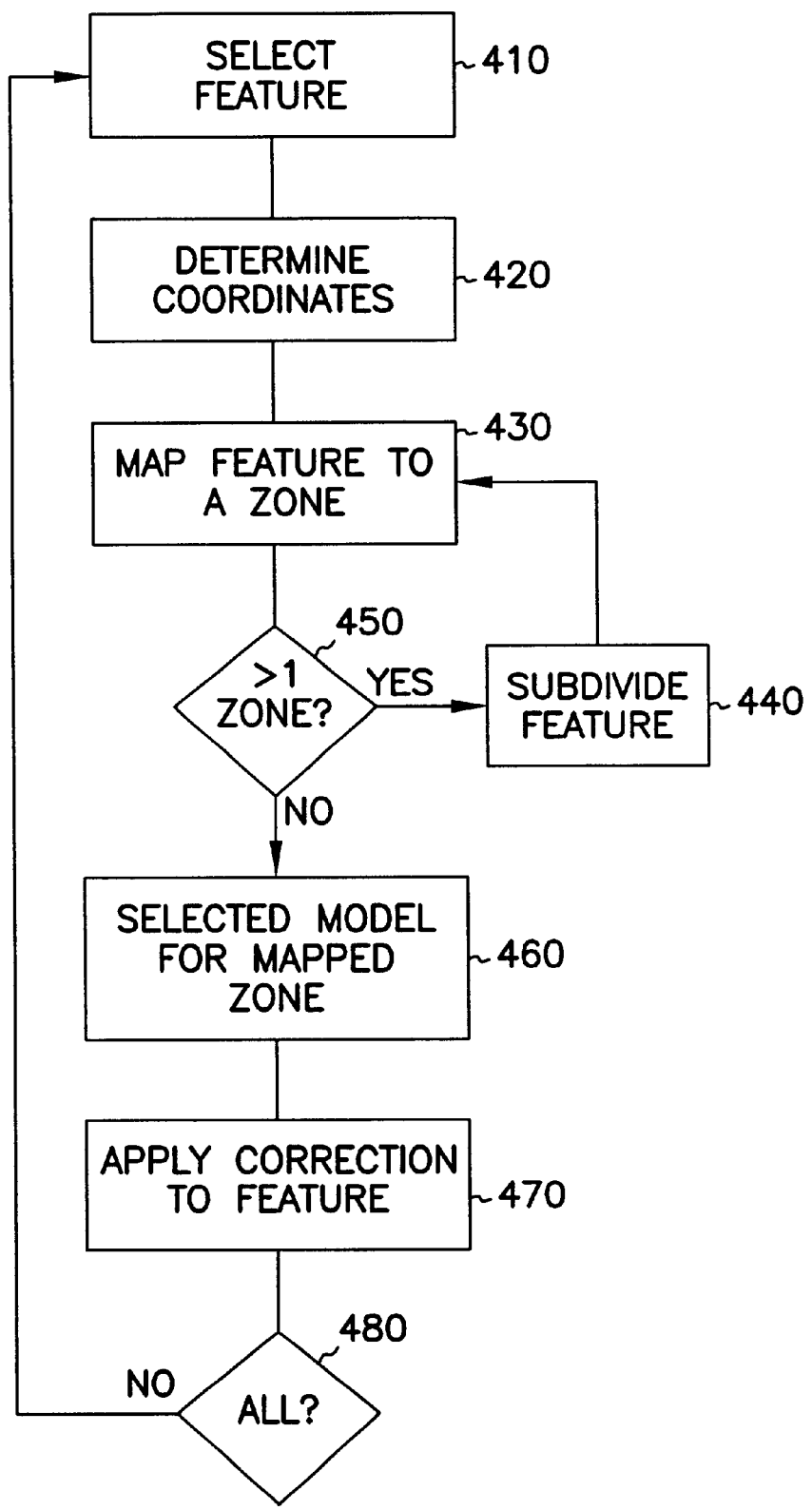
FIG. 4 is a high-level flowchart depicting one subprocess of the method depicted in FIG. 2.

FIG. 4 depicts one embodiment of processing found in action box 240. FIG. 4 includes action boxes 410, 420, 430, 440, 460 and 470, as well as decision boxes 450 and 480. In action box 410, the user selects a feature to which correction will be applied. This selection can be manual or through an automated routine. Once a feature is selected, action box 420 determines the coordinates of the feature. The coordinates define its position within an image pattern, and thus its position within the field of exposure. While it is conceivable that a user could manually enter coordinates, such coordinates are typically contained in a database defining all dimensional characteristics of the image pattern. A more practicable approach would then be to extract the desired data from the database.

Having determined the coordinates of the feature, these coordinates are used in action box 430 to map the feature into a zone of the field of exposure. It is virtually certain that some features will map into more than one zone. Decision box 450 directs control based on whether a feature is entirely contained within one zone, or extends across more than one zone. If the feature extends across more than one zone, the feature can be subdivided in action box 440 such that only that portion of the feature contained entirely within one zone is considered for correction based on that zone's model. Alternatively, a feature extending across more than one zone can be "mapped" to one zone based on criteria chosen by the user, e.g., mapping the feature to the zone which contains the largest or most critical portion of the feature.

The model defined for the mapped zone is selected in action box 460 and applied to the feature in action box 470. The resultant is corrected dimensions which modify the original feature dimensions to obtain a more accurate reproduction of the desired image on the target, taking into consideration the optics, the resist and the etch process. Decision box 480 is used to determine if any uncorrected features remain, directing control back to action box 410 if any so exist.

It should be apparent that where features extend across two or more zones, applying corrections in each zone will inherently produce a "stair-step" result along the feature, due to a different correction model being applied upon crossing the interface between zones. Despite this inherency, it is expected that the overall reduction in dimensional variation will outweigh the stair-step effect. Furthermore, if the stair-step effect is considered undesirable, further corrections can be applied to smooth or blend feature dimensions where the feature extends across a zone interface.

Figure 5:
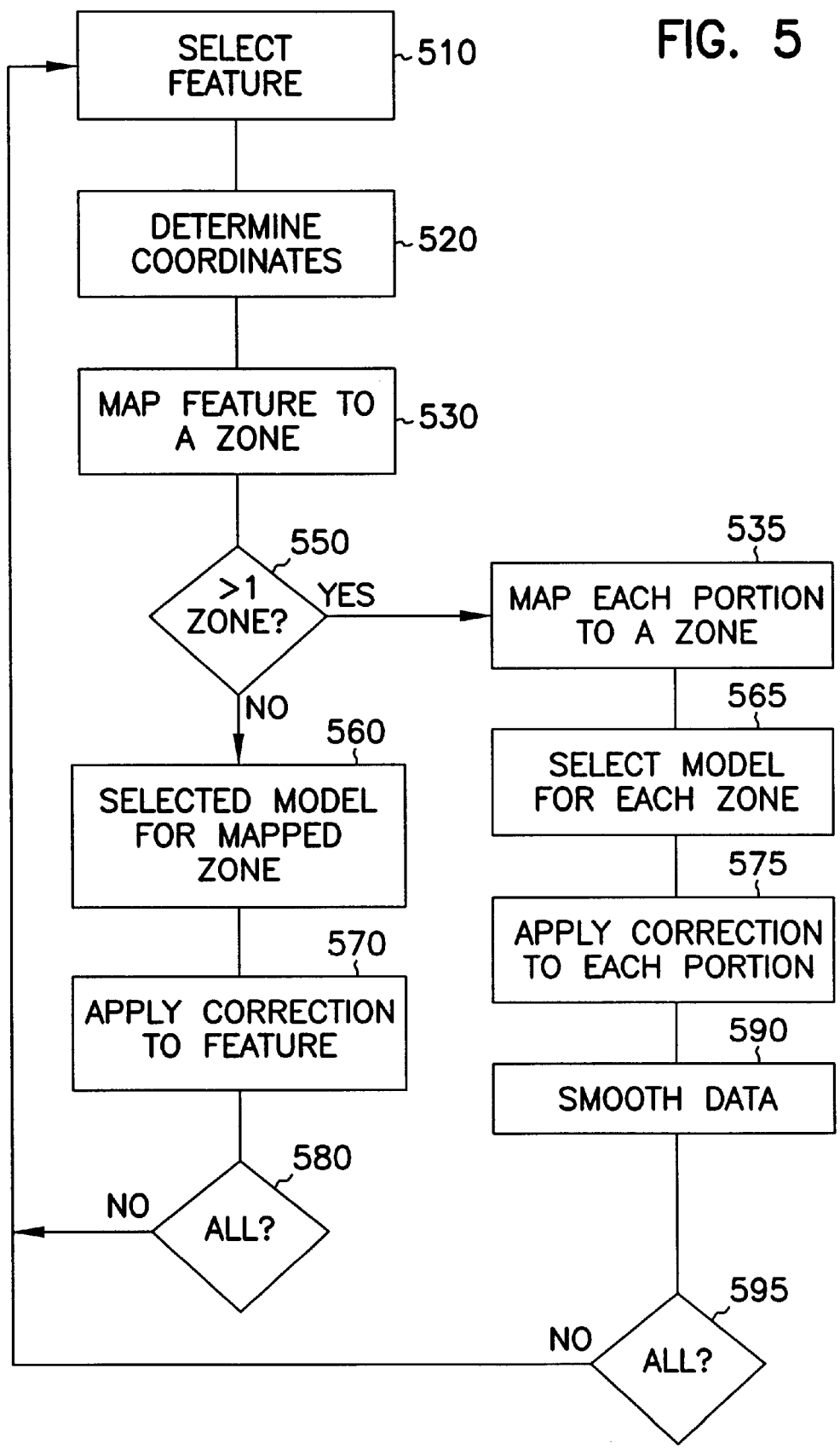
FIG. 5 is a high-level flowchart depicting an alternate subprocess of the method depicted in FIG. 2.

FIG. 5 depicts an alternate handling method where features extend across more than one zone. FIG. 5 includes action boxes 510, 520, 530, 535, 560, 565, 570, 575 and 590, as well as decision boxes 550, 580 and 595. Similar to the processing shown in FIG. 4, a feature is selected in action box 510, coordinates are determined in action box 520 and the feature is mapped in action box 530. Upon deciding if the feature extends across a zone interface, decision box 550 redirects control accordingly. If the feature is entirely contained in one zone, processing proceeds similar to the processing of FIG. 4, that is, a model is chosen in action box 460 and the correction is applied in action box 470. If the feature resides in more than one zone, control is directed to action box 535 where the feature is mapped into multiple zones. A model is chosen for each zone to which the feature is mapped in action box 565. The correction is applied to each portion of the feature in action box 575 based on the model for the zone in which that portion of the feature resides. The resulting feature dimensions are then further corrected in action box 590 to blend the inherent stair-step effect. Action box 590 may represent a leastsquares fit of the resulting data, a first order filter or other method known to smooth data.

Figure 6:
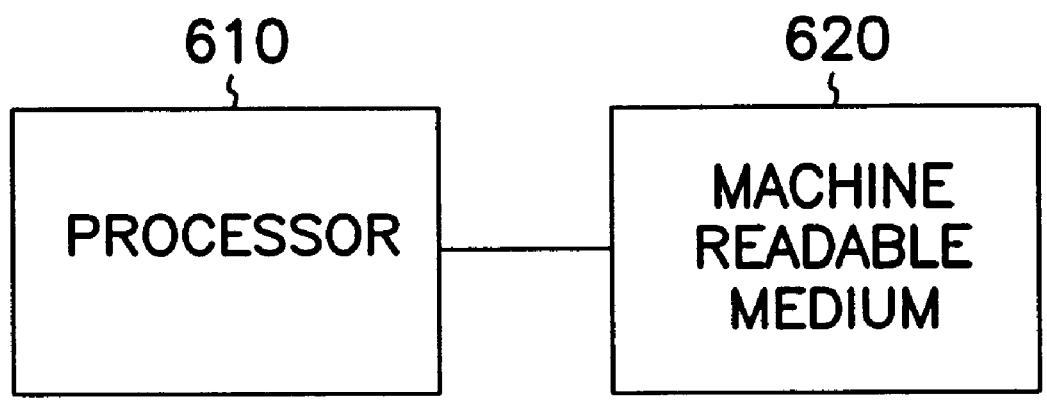
FIG. 6 is a block diagram of a system usable for practicing the invention.

FIG. 6 represents a system 600 usable for correcting masks in accordance with the invention. System 600 contains a processor 610 and a machine readable medium 620. Instructions for performing the methods depicted in FIGS. 2–5 are contained on the machine readable medium 620 to cause the processor 610 to apply the correction to the mask pattern. Machine readable medium 620 may be removable from system 600. The instructions may be in the form of a computer program or software capable of causing the processor to perform the methods depicted in FIGS. 2–5.

As recognized by those skilled in the art, semiconductor fabrication utilizes lithographic techniques in producing integrated circuits. An integrated circuit contains a variety of semiconductor devices resulting from a repeated process of applying layers to a substrate, masking those layers and patterning those layers. The integrated circuit is supported by a substrate. A substrate is often a silicon wafer, but can additionally refer to silicon-on-insulator (SOI) technology, silicon-on-sapphire (SOS) technology, thin film transistor (TFT) technology and other applicable support structures. The integrated circuits are typically repeated multiple times on each substrate. The substrate is further processed to separate the integrated circuits into dies as is well known in the art.

Figure 7:
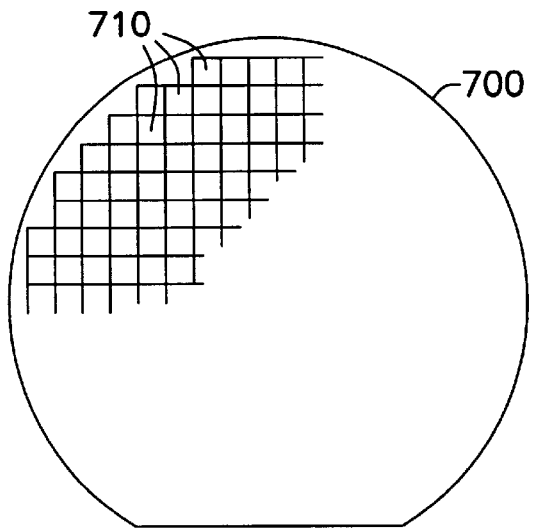
FIG. 7 is an elevation view of a substrate containing semiconductor dies.

With reference to FIG. 7, in one embodiment, a semiconductor die 710 is produced from a substrate 700. A die is an individual pattern, typically rectangular, on a substrate that contains circuitry to perform a specific function. A substrate will typically contain a repeated pattern of such dies containing the same functionality. Die 710 may contain circuitry, for example, of a memory device. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control. A die so packaged is commonly referred to as an integrated circuit chip. Die 710 is produced using photolithographic techniques as described herein using at least one mask corrected in accordance with the methods of the invention.

Figure 8:
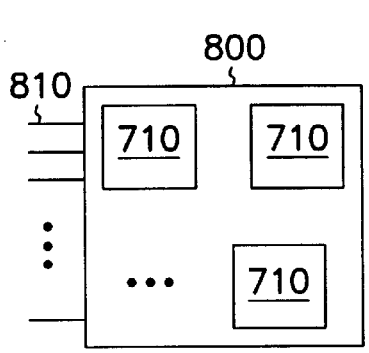
FIG. 8 is a block diagram of an exemplary circuit module.

As shown in FIG. 8, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom providing unilateral or bilateral communication and control.

Figure 9:
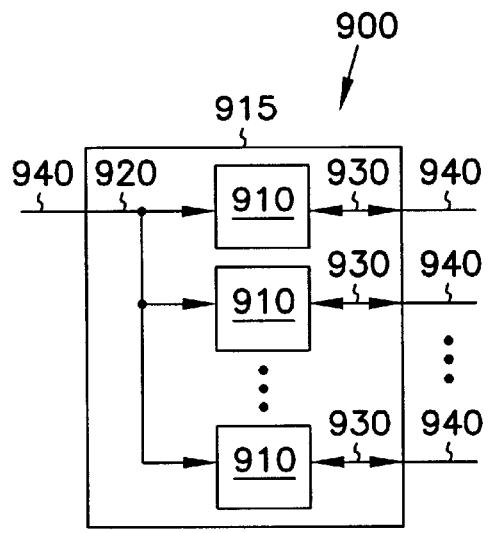
FIG. 9 is a block diagram of an exemplary memory module.

FIG. 9 shows one embodiment of a circuit module as memory module 900. Memory module 900 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 9.

Figure 10:
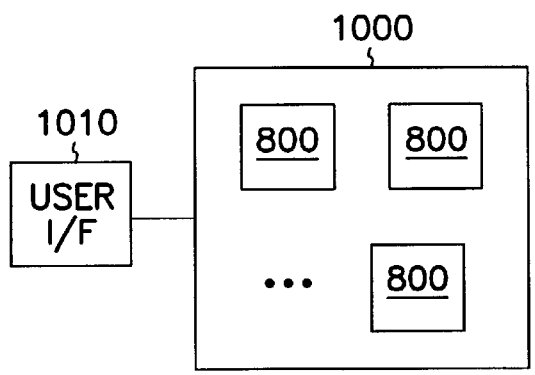
FIG. 10 is a block diagram of an exemplary electronic system.

FIG. 10 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 11:
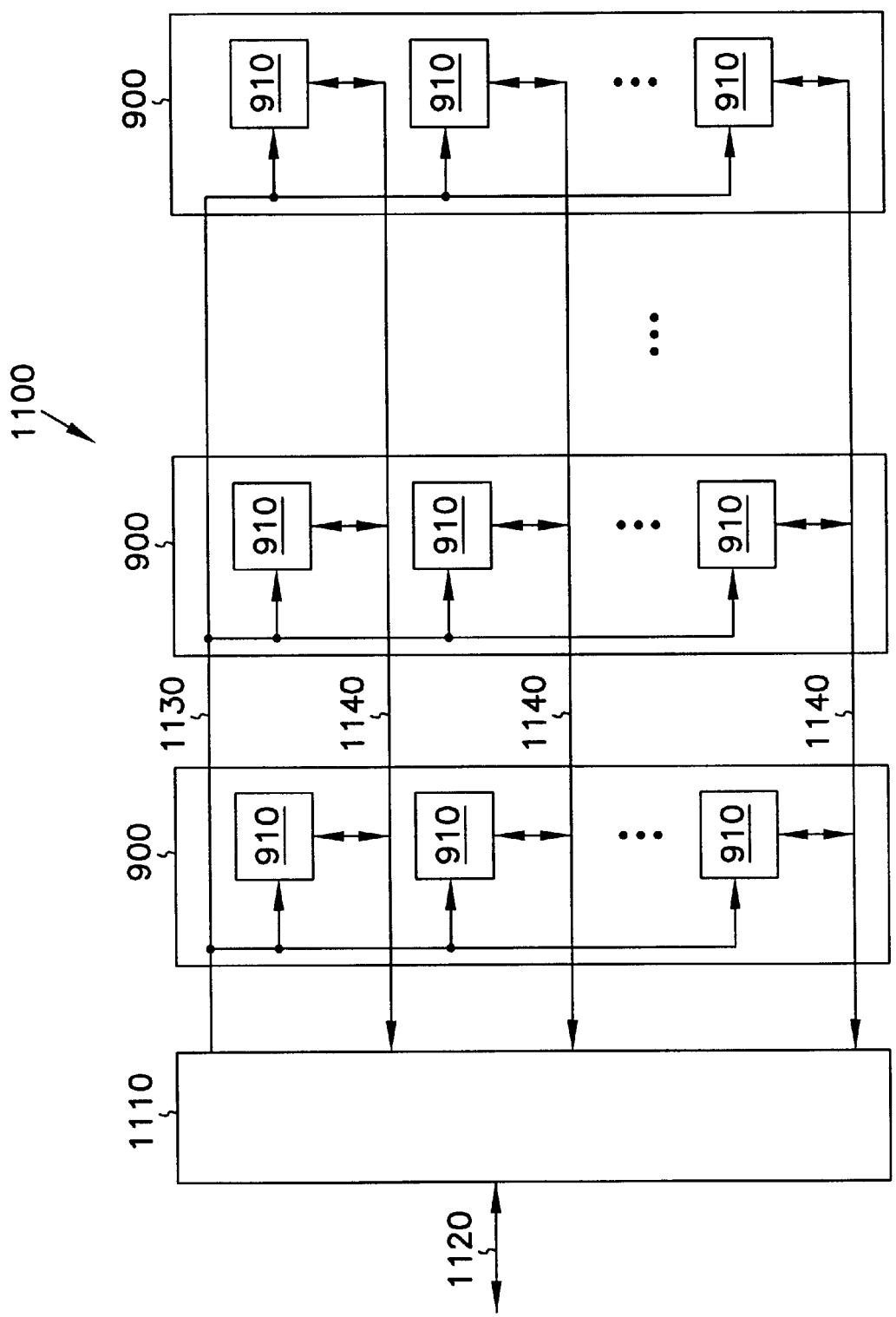
FIG. 11 is a block diagram of an exemplary memory system.

FIG. 11 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 12:
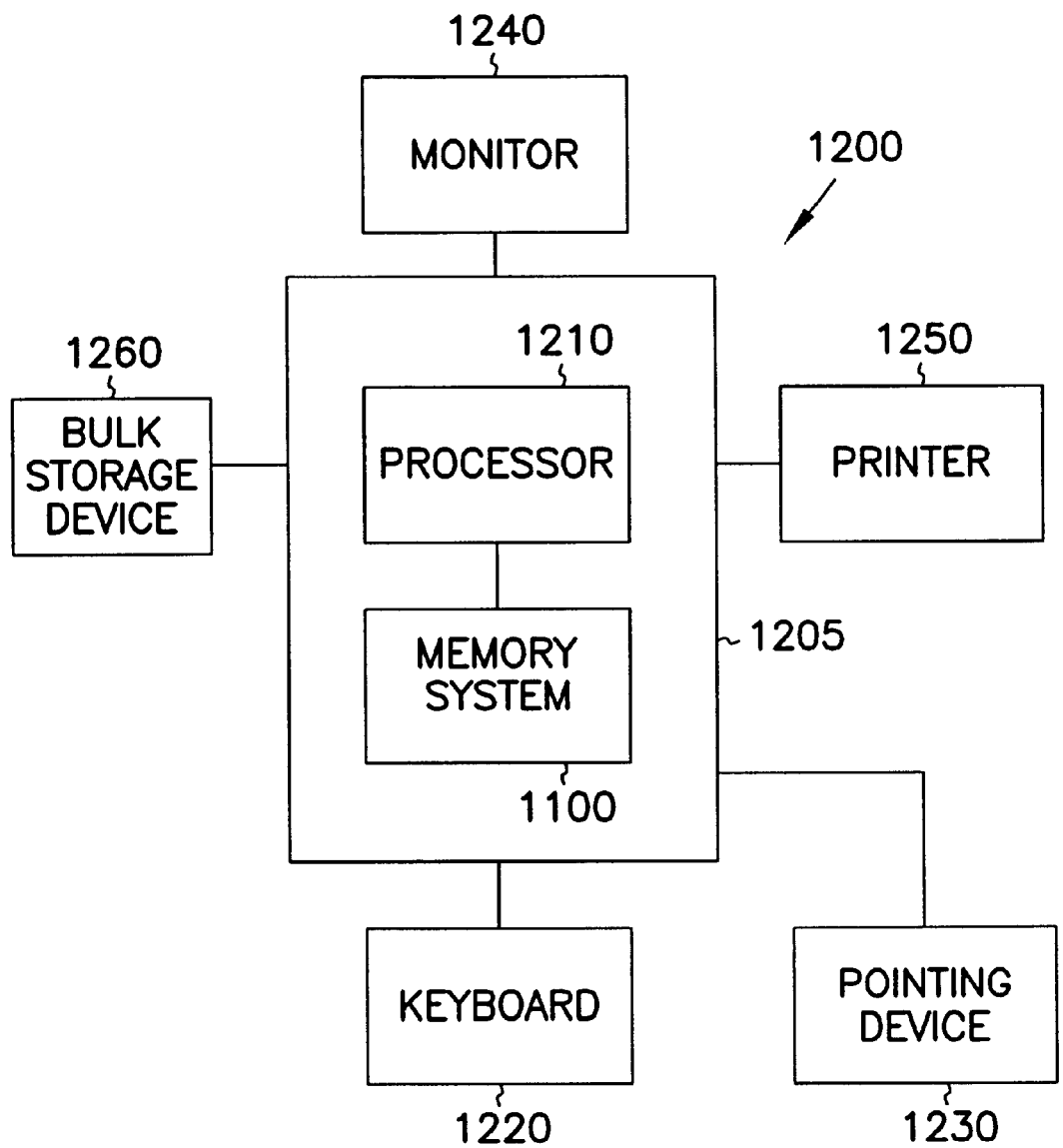
FIG. 12 is a block diagram of an exemplary computer system.

FIG. 12 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e. memory system 1100, as a subcomponent. Computer system 1200 optionally contains user interface components. Depicted in FIG. 12 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Conclusion

Methods of correcting for proximity effect have been described, wherein the methods account for intensity level variation across a field of exposure. The methods may be utilized to produce improved masks for reproducing a desired image on a target, often a semiconductor substrate. Furthermore, a system has been described to perform the correction methods. Apparatus produced from masks utilizing the correction methods have further been described.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. For example, any number of zones may be defined and any type of projection system may be used. Therefore, it is manifestly intended that this invention be limited only by the claims and the equivalents thereof.

What is claimed is:

1. A method of correcting a mask, comprising:

defining at least two zones within a field of the mask;

selecting a correction model for each of the at least two zones;

mapping a feature of the mask to one of the at least two zones; and modifying dimensions of the feature in response to the correction model for the zone in which the feature is mapped by smoothing the dimensions.

2. The method of claim 1, wherein modifying dimensions of the feature comprises an iterative process wherein the act of modifying is repeated.

3. The method of claim 1, wherein defining at least two zones comprises defining zones of like intensity determined by a process selected from the group consisting of determining the response of a series of test patterns, calculating lens aberrations and using other empirical correlations.

4. The method of claim 1, wherein modifying dimensions comprises modifying a database representation of a physical mask.

5. A method of correcting a mask having a plurality of features, comprising:

defining at least two zones within a field of the mask;

selecting a correction model for each of the at least two zones;

mapping each of the plurality of features to one of the at least two zones; and modifying dimensions of each of the plurality of features in response to the correction model for the zone in which each feature is mapped by smoothing the dimensions.

6. A method of correcting a mask having a plurality of features, comprising:

defining at least two zones within a field of the mask;

selecting a correction model for each of the at least two zones;

mapping each of the plurality of features to one of the at least two zones; and iteratively modifying dimensions of each of the plurality of features by smoothing the dimensions in response to the correction model for the zone in which each feature is mapped and further in response to changes in surrounding features.

7. A method of correcting a mask, comprising:

identifying a feature of the mask having multiple portions;

defining at least two zones within a field of the mask;

selecting a correction model for each of the at least two zones;

mapping each portion of the feature of the mask to one of the at least two zones; and modifying dimensions of each portion of the feature by smoothing in response to the correction model for the zone in which each portion of the feature is mapped.

8. A method of correcting a mask, comprising:

identifying a feature of the mask having multiple portions;

defining at least two zones within a field of the mask;

selecting a correction model for each of the at least two zones;

mapping each portion of the feature of the mask to one of the at least two zones;

modifying dimensions of each portion of the feature in response to the correction model for the zone in which each portion of the feature is mapped; and smoothing the dimensions of the feature.

9. A method of correcting a mask having a plurality of features, comprising:

defining at least two zones within a field of the mask;

selecting a correction model for each of the at least two zones;

mapping a portion of each of the plurality of features to one of the at least two zones; and iteratively modifying dimensions of the portion of each of the plurality of features by smoothing in response to the correction model for the zone in which each portion of each of the plurality of features is mapped and further in response to changes in surrounding features.

10. A method of correcting a mask having a plurality of features, comprising:

defining at least two zones within a field of the mask;

selecting a correction model for each of the at least two zones;

mapping a portion of each of the plurality of features to one of the at least two zones;

iteratively modifying dimensions of the portion of each of the plurality of features in response to the correction model for the zone in which each portion of each of the plurality of features is mapped and further in response to changes in surrounding features; and smoothing the dimensions of the features, wherein smoothing occurs after iteratively modifying dimensions.

11. A method of correcting a mask having a plurality of features, comprising:

defining at least two zones within a field of the mask;

selecting a correction model for each of the at least two zones;

mapping a portion of each of the plurality of features to one of the at least two zones;

iteratively modifying dimensions of the portion of each of the plurality of features in response to the correction model for the zone in which each portion of each of the plurality of features is mapped and further in response to changes in surrounding features; and smoothing the dimensions of the features, wherein smoothing occurs between iterations of iteratively modifying the dimensions.

12. A method of correcting a mask, comprising:

identifying a feature of the mask having multiple portions;

defining at least two zones within a field of the mask;

selecting a correction model for each of the at least two zones;

mapping each portion of the feature of the mask to one of the at least two zones;

modifying dimensions of each portion of the feature in response to the correction model for the zone in which each portion of the feature is mapped; and smoothing the dimensions of the feature, wherein smoothing the dimension of the feature occurs after modifying dimensions of each portion of the feature.

13. A semiconductor die, comprising:

a substrate; and an integrated circuit supported by the substrate, wherein the integrated circuit is produced by a process comprising the use of a mask, further wherein the mask is produced by a method comprising:

defining at least two zones within a field of the mask;

selecting a correction model for each of the at least two zones;

mapping a feature of the mask to one of the at least two zones; and modifying dimensions of the feature by smoothing the dimensions in response to the correction model for the zone in which the feature is mapped.

14. A semiconductor die, comprising:

a substrate; and an integrated circuit supported by the substrate, wherein the integrated circuit is produced by a process comprising the use of a mask having a plurality of features, further wherein the mask is produced by a method comprising:

defining at least two zones within a field of the mask;

selecting a correction model for each of the at least two zones;

mapping each of the plurality of features to one of the at least two zones; and modifying and smoothing dimensions of each of the plurality of features in response to the correction model for the zone in which each feature is mapped.

15. A semiconductor die, comprising:

a substrate; and an integrated circuit supported by the substrate, wherein the integrated circuit is produced by a process comprising the use of a mask, further wherein the mask is produced by a method comprising:

identifying a feature of the mask having multiple portions;

defining at least two zones within a field of the mask;

selecting a correction model for each of the at least two zones;

mapping each portion of the feature of the mask to one of the at least two zones; and modifying dimensions of each portion of the feature by smoothing the dimensions in response to the correction model for the zone in which each portion of the feature is mapped.

16. A semiconductor die, comprising:

a substrate; and an integrated circuit supported by the substrate, wherein the integrated circuit is produced by a process comprising the use of a mask, further wherein the mask is produced by a method comprising:

identifying a feature of the mask having multiple portions;

defining at least two zones within a field of the mask;

selecting a correction model for each of the at least two zones;

mapping each portion of the feature of the mask to one of the at least two zones;

modifying dimensions of each portion of the feature in response to the correction model for the zone in which each portion of the feature is mapped; and smoothing the dimensions of the feature.

17. A semiconductor die, comprising:

a substrate; and an integrated circuit supported by the substrate, wherein the integrated circuit is produced by a process comprising the use of a mask having a plurality of features, further wherein the mask is produced by a method comprising:

defining at least two zones within a field of the mask;

selecting a correction model for each of the at least two zones;

mapping a portion of each of the plurality of features to one of the at least two zones;

iteratively modifying dimensions of the portion of each of the plurality of features in response to the correction model for the zone in which each portion of each of the plurality of features is mapped and further in response to changes in surrounding features; and smoothing the dimensions of the features, wherein smoothing occurs at least one time selected from the group consisting of:
A) after iteratively modifying the dimensions; and
B) between iterations of the act of iteratively modifying the dimensions.

18. An integrated circuit chip, comprising:

a substrate;

an integrated circuit supported by the substrate, wherein the integrated circuit is produced by a process comprising the use of a mask, further wherein the mask is produced by a method comprising:
defining at least two zones within a field of the mask;
selecting a correction model for each of the at least two zones;
mapping a feature of the mask to one of the at least two zones; and
modifying dimensions of the feature by smoothing the dimensions in response to the correction model for the zone in which the feature is mapped;

at least one lead extending from the integrated circuit; and a protective casing surrounding the substrate and the integrated circuit.

19. An integrated circuit chip, comprising:

a substrate;

an integrated circuit supported by the substrate, wherein the integrated circuit is produced by a process comprising the use of a mask having a plurality of features, further wherein the mask is produced by a method comprising:
defining at least two zones within a field of the mask;
selecting a correction model for each of the at least two zones;
mapping each of the plurality of features to one of the at least two zones; and
modifying dimensions of each of the plurality of features by smoothing the dimensions in response to the correction model for the zone in which each feature is mapped;

at least one lead extending from the integrated circuit; and a protective casing surrounding the substrate and the integrated circuit.

20. An integrated circuit chip, comprising:

a substrate;

an integrated circuit supported by the substrate, wherein the integrated circuit is produced by a process comprising the use of a mask, further wherein the mask is produced by a method comprising:
identifying a feature of the mask having multiple portions;
defining at least two zones within a field of the mask;
selecting a correction model for each of the at least two zones;
mapping each portion of the feature of the mask to one of the at least two zones; and
modifying dimensions of each portion of the feature by smoothing the dimensions in response to the correction model for the zone in which each portion of the feature is mapped;

at least one lead extending from the integrated circuit; and a protective casing surrounding the substrate and the integrated circuit.

21. An integrated circuit chip, comprising:

a substrate;

an integrated circuit supported by the substrate, wherein the integrated circuit is produced by a process comprising the use of a mask, further wherein the mask is produced by a method comprising:
identifying a feature of the mask having multiple portions;
defining at least two zones within a field of the mask;
selecting a correction model for each of the at least two zones;
mapping each portion of the feature of the mask to one of the at least two zones;
modifying dimensions of each portion of the feature in response to the correction model for the zone in which each portion of the feature is mapped; and
smoothing the dimensions of the feature;

at least one lead extending from the integrated circuit; and a protective casing surrounding the substrate and the integrated circuit.

22. An integrated circuit chip, comprising:

a substrate;

an integrated circuit supported by the substrate, wherein the integrated circuit is produced by a process comprising the use of a mask having a plurality of features, further wherein the mask is produced by a method comprising:
defining at least two zones within a field of the mask;
selecting a correction model for each of the at least two zones;
mapping a portion of each of the plurality of features to one of the at least two zones;
iteratively modifying dimensions of the portion of each of the plurality of features in response to the correction model for the zone in which each portion of each of the plurality of features is mapped and further in response to changes in surrounding features; and
smoothing the dimensions of the features, wherein smoothing occurs at least one time selected from the group consisting of:
A) after iteratively modifying dimensions: and
B) between iterations of the act of iteratively modifying the dimensions;

at least one lead extending from the integrated circuit; and a protective casing surrounding the substrate and the integrated circuit.

23. A circuit module, comprising:

a support;

a plurality of leads extending from the support; and at least one semiconductor die contained on the support and coupled to the plurality of leads, wherein the at least one semiconductor die comprises an integrated circuit, further wherein the integrated circuit is produced by a process comprising the use of a mask, still further wherein the mask is produced by a method comprising:
defining at least two zones within a field of the mask;
selecting a correction model for each of the at least two zones;
mapping a feature of the mask to one of the at least two zones; and
modifying dimensions of the feature in response to the correction model for the zone in which the feature is mapped by smoothing the dimensions.

24. A circuit module, comprising:
a support;
a plurality of leads extending from the support; and
at least one semiconductor die contained on the support and coupled to the plurality of leads, wherein the at least one semiconductor die comprises an integrated circuit, further wherein the integrated circuit is produced by a process comprising the use of a mask having a plurality of features, still further wherein the mask is produced by a method comprising:
defining at least two zones within a field of the mask;
selecting a correction model for each of the at least two zones;
mapping each of the plurality of features to one of the at least two zones; and
modifying dimensions of each of the plurality of features in response to the correction model for the zone in which each feature is mapped by smoothing the dimensions.

25. A circuit module, comprising:
a support;
a plurality of leads extending from the support; and
at least one semiconductor die contained on the support and coupled to the plurality of leads, wherein the at least one semiconductor die comprises an integrated circuit, further wherein the integrated circuit is produced by a process comprising the use of a mask, still further wherein the mask is produced by a method comprising:
identifying a feature of the mask having multiple portions;
defining at least two zones within a field of the mask;
selecting a correction model for each of the at least two zones;
mapping each portion of the feature of the mask to one of the at least two zones; and
modifying dimensions of each portion of the feature by smoothing in response to the correction model for the zone in which each portion of the feature is mapped.

26. A circuit module, comprising:
a support;
a plurality of leads extending from the support; and
at least one semiconductor die contained on the support and coupled to the plurality of leads, wherein the at least one semiconductor die comprises an integrated circuit, further wherein the integrated circuit is produced by a process comprising the use of a mask, still further wherein the mask is produced by a method comprising:
identifying a feature of the mask having multiple portions;
defining at least two zones within a field of the mask;
selecting a correction model for each of the at least two zones;
mapping each portion of the feature of the mask to one of the at least two zones;
modifying dimensions of each portion of the feature in response to the correction model for the zone in which each portion of the feature is mapped; and
smoothing the dimensions of the feature.

27. A circuit module, comprising:
a support;
a plurality of leads extending from the support; and
at least one semiconductor die contained on the support and coupled to the plurality of leads, wherein the at least one semiconductor die comprises an integrated circuit, further wherein the integrated circuit is produced by a process comprising the use of a mask having a plurality of features, still further wherein the mask is produced by a method comprising:
defining at least two zones within a field of the mask;
selecting a correction model for each of the at least two zones;
mapping a portion of each of the plurality of features to one of the at least two zones;
iteratively modifying dimensions of the portion of each of the plurality of features in response to the correction model for the zone in which each portion of each of the plurality of features is mapped and further in response to changes in surrounding features; and
smoothing the dimensions of the features, wherein smoothing occurs at least one time selected from the group consisting of:
A) after iteratively modifying dimensions; and
B) between iterations of the act of iteratively modifying the dimensions.

28. An electronic system, comprising:
a processor; and
at least one circuit module, wherein the at least one circuit module comprises:
a support;
a plurality of leads extending from the support and coupled to the processor; and
at least one semiconductor die contained on the support and coupled to the plurality of leads, wherein the at least one semiconductor die comprises an integrated circuit, further wherein the integrated circuit is produced by a process comprising the use of a mask, still further wherein the mask is produced by a method comprising:
defining at least two zones within a field of the mask;
selecting a correction model for each of the at least two zones;
mapping a feature of the mask to one of the at least two zones; and
modifying dimensions of the feature by smoothing or blending the dimensions in response to the correction model for the zone in which the feature is mapped.

29. An electronic system, comprising:
a processor; and
at least one circuit module, wherein the at least one circuit module comprises:
a support;
a plurality of leads extending from the support and coupled to the processor; and
at least one semiconductor die contained on the support and coupled to the plurality of leads, wherein the at least one semiconductor die comprises an integrated circuit, further wherein the integrated circuit is produced by a process comprising the use of a mask having a plurality of features, still further wherein the mask is produced by a method comprising:
defining at least two zones within a field of the mask;
selecting a correction model for each of the at least two zones;
mapping each of the plurality of features to one of the at least two zones; and
modifying dimensions of each of the plurality of features by smoothing or blending the dimensions in response to the correction model for the zone in which each feature is mapped.

30. An electronic system, comprising:
a processor; and
at least one circuit module, wherein the at least one circuit module comprises:
- a support;
- a plurality of leads extending from the support and coupled to the processor; and
- at least one semiconductor die contained on the support and coupled to the plurality of leads, wherein the at least one semiconductor die comprises an integrated circuit, further wherein the integrated circuit is produced by a process comprising the use of a mask, still further wherein the mask is produced by a method comprising:
  - identifying a feature of the mask having multiple portions;
  - defining at least two zones within a field of the mask;
  - selecting a correction model for each of the at least two zones;
  - mapping each portion of the feature of the mask to one of the at least two zones; and
  - modifying dimensions of each portion of the feature by smoothing the dimensions in response to the correction model for the zone in which each portion of the feature is mapped.

31. An electronic system, comprising:
a processor; and
at least one circuit module, wherein the at least one circuit module comprises:
- a support;
- a plurality of leads extending from the support and coupled to the processor; and
- at least one semiconductor die contained on the support and coupled to the plurality of leads, wherein the at least one semiconductor die comprises an integrated circuit, further wherein the integrated circuit is produced by a process comprising the use of a mask, still further wherein the mask is produced by a method comprising:
  - identifying a feature of the mask having multiple portions;
  - defining at least two zones within a field of the mask;
  - selecting a correction model for each of the at least two zones;
  - mapping each portion of the feature of the mask to one of the at least two zones;
  - modifying dimensions of each portion of the feature in response to the correction model for the zone in which each portion of the feature is mapped; and
  - smoothing the dimensions of the feature.

32. An electronic system, comprising:
a processor; and
at least one circuit module, wherein the at least one circuit module comprises:
- a support;
- a plurality of leads extending from the support and coupled to the processor; and
- at least one semiconductor die contained on the support and coupled to the plurality of leads, wherein the at least one semiconductor die comprises an integrated circuit, further wherein the integrated circuit is produced by a process comprising the use of a mask having a plurality of features, still further wherein the mask is produced by a method comprising:
  - defining at least two zones within a field of the mask;
  - selecting a correction model for each of the at least two zones;
  - mapping a portion of each of the plurality of features to one of the at least two zones;
  - iteratively modifying dimensions of the portion of each of the plurality of features in response to the correction model for the zone in which each portion of each of the plurality of features is mapped and further in response to changes in surrounding features; and
  - smoothing the dimensions of the features, wherein smoothing occurs at least one time selected from the group consisting of:
    A) after iteratively modifying the dimensions; and
    B) between iterations of the act of iteratively modifying the dimensions.

33. A system for performing corrections to a mask, the system comprising:
a processor; and
a machine readable medium coupled to the processor, wherein the machine readable medium has instructions contained thereon to cause the processor to perform a method of correcting the mask, the method comprising:
- defining at least two zones within a field of the mask;
- selecting a correction model for each of the at least two zones;
- mapping a feature of the mask to one of the at least two zones; and
- modifying dimensions of the feature by smoothing or blending the dimensions in response to the correction model for the zone in which the feature is mapped.

34. A system for performing corrections to a mask having a plurality of features, the system comprising:
a processor; and
a machine readable medium coupled to the processor, wherein the machine readable medium has instructions contained thereon to cause the processor to perform a method of correcting the mask, the method comprising:
- defining at least two zones within a field of the mask;
- selecting a correction model for each of the at least two zones;
- mapping each of the plurality of features to one of the at least two zones; and
- iteratively modifying dimensions of each of the plurality of features by smoothing the dimensions in response to the correction model for the zone in which each feature is mapped and further in response to changes in surrounding features.

35. A system for performing corrections to a mask, the system comprising:
a processor; and
a machine readable medium coupled to the processor, wherein the machine readable medium has instructions contained thereon to cause the processor to perform a method of correcting the mask, the method comprising:
- identifying a feature of the mask having multiple portions;
- defining at least two zones within a field of the mask;
- selecting a correction model for each of the at least two zones;
- mapping each portion of the feature of the mask to one of the at least two zones; and
- modifying dimensions of each portion of the feature by smoothing the dimensions in response to the correction model for the zone in which each portion of the feature is mapped.

36. A system for performing corrections to a mask, the system comprising:

a processor; and a machine readable medium coupled to the processor, wherein the machine readable medium has instructions contained thereon to cause the processor to perform a method of correcting the mask, the method comprising:
identifying a feature of the mask having multiple portions;
defining at least two zones within a field of the mask;
selecting a correction model for each of the at least two zones;
mapping each portion of the feature of the mask to one of the at least two zones;
modifying dimensions of each portion of the feature in response to the correction model for the zone in which each portion of the feature is mapped; and
smoothing the dimensions of the feature.

37. A system for performing corrections to a mask having a plurality of features, the system comprising:

a processor; and a machine readable medium coupled to the processor, wherein the machine readable medium has instructions contained thereon to cause the processor to perform a method of correcting the mask, the method comprising:
defining at least two zones within a field of the mask;
selecting a correction model for each of the at least two zones;
mapping a portion of each of the plurality of features to one of the at least two zones; and
iteratively modifying dimensions of the portion of each of the plurality of features by smoothing the dimensions in response to the correction model for the zone in which each portion of each of the plurality of features is mapped and further in response to changes in surrounding features.

38. A machine readable medium having instructions contained thereon to cause a processor to perform a method of correcting a mask, the method comprising:
defining at least two zones within a field of the mask;
selecting a correction model for each of the at least two zones;
mapping a feature of the mask to one of the at least two zones; and
modifying dimensions of the feature by smoothing the dimensions in response to the correction model for the zone in which the feature is mapped.

39. A machine readable medium having instructions contained thereon to cause a processor to perform a method of correcting a mask, the method comprising:
defining at least two zones within a field of the mask;
selecting a correction model for each of the at least two zones;
mapping each of the plurality of features to one of the at least two zones; and
iteratively modifying dimensions of each of the plurality of features by smoothing the dimensions in response to the correction model for the zone in which each feature is mapped and further in response to changes in surrounding features.

40. A machine readable medium having instructions contained thereon to cause a processor to perform a method of correcting a mask, the method comprising:
identifying a feature of the mask having multiple portions;
defining at least two zones within a field of the mask;
selecting a correction model for each of the at least two zones;
mapping each portion of the feature of the mask to one of the at least two zones; and
modifying dimensions of each portion of the feature by smoothing the dimensions in response to the correction model for the zone in which each portion of the feature is mapped.

41. A machine readable medium having instructions contained thereon to cause a processor to perform a method of correcting a mask, the method comprising:
identifying a feature of the mask having multiple portions;
defining at least two zones within a field of the mask;
selecting a correction model for each of the at least two zones;
mapping each portion of the feature of the mask to one of the at least two zones;
modifying dimensions of each portion of the feature in response to the correction model for the zone in which each portion of the feature is mapped; and
smoothing the dimensions of the feature.

42. A method of producing a physical mask, comprising:
generating a database representation of the mask;
correcting the database representation, thereby producing a corrected database representation, wherein correcting the database representation comprises:
defining at least two zones within a field of the mask;
selecting a correction model for each of the at least two zones;
mapping a feature of the mask to one of the at least two zones; and
modifying dimensions of the feature by filtering the dimensions in response to the correction model for the zone in which the feature is mapped; and
selectively establishing opaque areas on a clear support in response to the corrected database representation.

43. A method of producing a physical mask, comprising:
generating a database representation of the mask;
correcting the database representation, thereby producing a corrected database representation, wherein correcting the database representation comprises:
defining at least two zones within a field of the mask, wherein defining at least two zones comprises defining zones of like intensity determined by a process selected from the group consisting of determining the response of a series of test patterns, calculating lens aberrations and using other empirical correlations;
selecting a correction model for each of the at least two zones;
mapping a feature of the mask to one of the at least two zones; and
modifying dimensions of the feature by filtering the dimensions in response to the correction model for the zone in which the feature is mapped; and
selectively establishing opaque areas on a clear support in response to the corrected database representation.

44. A method of producing a physical mask, comprising:
generating a database representation of the mask;
correcting the database representation, thereby producing a corrected database representation, wherein correcting the database representation comprises:
identifying a feature of the mask having multiple portions;
defining at least two zones within a field of the mask;
selecting a correction model for each of the at least two zones;

mapping each portion of the feature of the mask to one of the at least two zones; and modifying dimensions of each portion of the feature by filtering the dimensions in response to the correction model for the zone in which each portion of the feature is mapped; and selectively establishing opaque areas on a clear support in response to the corrected database representation.

45. A method of producing a physical mask, comprising:

generating a database representation of the mask;

correcting the database representation, thereby producing a corrected database representation, wherein correcting the database representation comprises:
  identifying a feature of the mask having multiple portions;
  defining at least two zones within a field of the mask;
  selecting a correction model for each of the at least two zones;
  mapping each portion of the feature of the mask to one of the at least two zones;
  modifying dimensions of each portion of the feature by smoothing the dimensions in response to the correction model for the zone in which each portion of the feature is mapped; and
  smoothing the dimensions of the feature; and selectively establishing opaque areas on a clear support in response to the corrected database representation.

46. A mask, comprising:

a clear support;

at least one opaque area on the support; and at least one clear area on the support;

wherein the mask is produced by a method comprising:
  defining at least two zones within a field of the mask;
  selecting a correction model for each of the at least two zones;
  mapping each at least one opaque area of the mask to one of the at least two zones; and
  modifying dimensions of each at least one opaque area in response to the correction model for the zone in which each at least one opaque area is mapped by smoothing the dimensions.

47. A mask, comprising:

a clear support;

at least one opaque area on the support having multiple portions; and at least one clear area on the support;

wherein the mask is produced by a method comprising:
  defining at least two zones within a field of the mask;
  selecting a correction model for each of the at least two zones;
  mapping each portion of each at least one opaque area of the mask to one of the at least two zones; and
  modifying dimensions of each portion of each at least one opaque area in response to the correction model for the zone in which each portion of each at least one opaque area is mapped by smoothing the dimensions of each portion.

48. A mask, comprising:

a clear support;

at least one opaque area on the support having portions; and at least one clear area on the support;

wherein the mask is produced by a method comprising:
  defining at least two zones within a field of the mask;
  selecting a correction model for each of the at least two zones;
  mapping each portion of each at least one opaque area of the mask to one of the at least two zones;
  modifying dimensions of each portion of each at least one opaque area in response to the correction model for the zone in which each portion of each at least one opaque area is mapped; and
  smoothing the dimensions of each at least one opaque area.

49. A method of patterning an integrated circuit, comprising:

depositing a layer of resist on a substrate; and projecting energy through a mask onto the layer of resist;

wherein the mask is produced by a method comprising:
  defining at least two zones within a field of the mask;
  selecting a correction model for each of the at least two zones;
  mapping a feature of the mask to one of the at least two zones; and
  modifying dimensions of the feature in response to the correction model for the zone in which the feature is mapped by smoothing the dimensions of the feature.

50. A method of patterning an integrated circuit, comprising:

depositing a layer of resist on a substrate; and projecting energy through a mask onto the layer of resist;

wherein the mask is produced by a method comprising:
  identifying a feature of the mask having multiple portions;
  defining at least two zones within a field of the mask;
  selecting a correction model for each of the at least two zones;
  mapping each portion of the feature of the mask to one of the at least two zones;
  modifying dimensions of each portion of the feature in response to the correction model for the zone in which each portion of the feature is mapped; and
  smoothing the dimensions of the feature, wherein smoothing the dimension of the feature occurs after modifying dimensions of each portion of the feature.

* * * * *